US011885036B2

(12) United States Patent
Appel et al.

(10) Patent No.: US 11,885,036 B2
(45) Date of Patent: Jan. 30, 2024

(54) PRODUCING A RIBBON OR WAFER WITH REGIONS OF LOW OXYGEN CONCENTRATION

(71) Applicant: Leading Edge Equipment Technologies, Inc., Wilmington, MA (US)

(72) Inventors: Jesse S. Appel, South Hamilton, MA (US); Alison Greenlee, Somerville, MA (US); Nathan Stoddard, Chalfont, PA (US); Peter Kellerman, Essex, MA (US); Parthiv Daggolu, Danvers, MA (US); Alexander Martinez, Woburn, MA (US); Saeed Pirooz, Lexington, MA (US); Brandon Williard, Essex, MA (US); Charles Bowen, Hampton, NH (US); Brian McMullen, Taunton, MA (US); David Morrell, Wakefield, MA (US); Dawei Sun, Lynnfield, MA (US)

( * ) Notice: Subject to any disclaimer, the term of this patent is extended or adjusted under 35 U.S.C. 154(b) by 106 days.

(21) Appl. No.: 17/634,176

(22) PCT Filed: Aug. 9, 2020

(86) PCT No.: PCT/US2020/045552
§ 371 (c)(1),
(2) Date: Feb. 9, 2022

(87) PCT Pub. No.: WO2021/030236
PCT Pub. Date: Feb. 18, 2021

(65) Prior Publication Data
US 2022/0316087 A1    Oct. 6, 2022

Related U.S. Application Data

(60) Provisional application No. 62/884,851, filed on Aug. 9, 2019.

(51) Int. Cl.
*C30B 29/64* (2006.01)
*C30B 15/06* (2006.01)
(Continued)

(52) U.S. Cl.
CPC .............. *C30B 15/06* (2013.01); *C30B 29/06* (2013.01); *C30B 29/64* (2013.01); *H01L 31/04* (2013.01)

(58) Field of Classification Search
CPC ..................................................... C30B 29/64
See application file for complete search history.

(56) References Cited

U.S. PATENT DOCUMENTS

| 3,945,864 A | 3/1976 | Goldsmith et al. |
| 4,548,654 A | 10/1985 | Tobin |

(Continued)

FOREIGN PATENT DOCUMENTS

| CN | 101892515 A | 11/2010 |
| EP | 2343139 A1 | 7/2011 |

(Continued)

OTHER PUBLICATIONS

WIPO, International Search Report for International Application No. PCT/US2020/045552, dated Feb. 26, 2021.

(Continued)

*Primary Examiner* — Elizabeth E Mulvaney
(74) *Attorney, Agent, or Firm* — Hodgson Russ LLP

(57) ABSTRACT

A ribbon is formed such that the ribbon floats on a melt using a cold initializer facing an exposed surface of the melt. The ribbon is single crystal silicon. The ribbon is pulled from the silicon melt at a low angle off the melt surface. The ribbon is formed at a same rate as the pulling. The ribbon is separated from the melt at a wall of the crucible where a stable meniscus forms. The ribbon has a thickness between a first surface and an opposite second surface from 50 μm to (Continued)

Wafer Thickness Profile 5 mm. The ribbon includes a first region extending a first depth from the first surface. The first region has a reduced oxygen concentration relative to a bulk of the ribbon.

41 Claims, 8 Drawing Sheets

(51) Int. Cl.
*C30B 29/06* (2006.01)
*H01L 31/04* (2014.01)

(56) References Cited

U.S. PATENT DOCUMENTS

| | | | |
|---|---|---|---|
| 5,882,989 | A | 3/1999 | Falster |
| 6,100,570 | A | 8/2000 | Saito |
| 6,117,231 | A | 9/2000 | Fusegawa et al. |
| 6,325,848 | B1 | 12/2001 | Watanabe |
| 6,518,200 | B2 | 2/2003 | Lin |
| 6,544,656 | B1 | 4/2003 | Abe et al. |
| 6,566,277 | B1 | 5/2003 | Nakagawa et al. |
| 6,583,024 | B1 | 6/2003 | Kononchuk et al. |
| 6,713,370 | B2 | 3/2004 | Falster |
| 6,780,238 | B2 | 8/2004 | Park |
| 6,815,605 | B1 | 11/2004 | Abe et al. |
| 7,147,711 | B2 | 12/2006 | Tamatsuka et al. |
| 7,893,351 | B2 | 2/2011 | Terakawa |
| 7,923,625 | B2 | 4/2011 | Shima et al. |
| 8,124,867 | B2 | 2/2012 | Shima et al. |
| 8,252,624 | B2 | 8/2012 | Tanner et al. |
| 8,349,643 | B2 | 1/2013 | Terakawa |
| 8,383,927 | B2 | 2/2013 | Shima et al. |
| 8,628,995 | B2 | 1/2014 | Myong |
| 8,642,449 | B2 | 2/2014 | Watanabe et al. |
| 8,648,251 | B2 | 2/2014 | Myong |
| 8,771,415 | B2 | 7/2014 | Umeno et al. |
| 9,105,786 | B2 | 8/2015 | Deluca |
| 9,123,671 | B2 | 9/2015 | Chen et al. |
| 9,166,071 | B2 | 10/2015 | Phan et al. |
| 9,331,226 | B2 | 5/2016 | Yano et al. |
| 9,337,372 | B2 | 5/2016 | Ogane et al. |
| 9,917,219 | B2 | 3/2018 | Yano |
| 9,951,440 | B2 | 4/2018 | Basak et al. |
| 10,340,403 | B2 | 7/2019 | Ogane et al. |
| 2006/0043517 | A1 | 3/2006 | Sasaki et al. |
| 2007/0034251 | A1 | 2/2007 | Jonczyk et al. |
| 2009/0233396 | A1 | 9/2009 | Kellerman et al. |
| 2009/0266396 | A1 | 10/2009 | Niira et al. |
| 2010/0015749 | A1 | 1/2010 | Borden |
| 2010/0059114 | A1 | 3/2010 | Park et al. |
| 2011/0020974 | A1 | 1/2011 | Shima |
| 2011/0146770 | A1 | 6/2011 | Dieter et al. |
| 2011/0271899 | A1 | 11/2011 | Kellerman et al. |
| 2011/0280784 | A1 | 11/2011 | Ydstie et al. |
| 2011/0297223 | A1 | 12/2011 | Krause et al. |
| 2011/0303265 | A1 | 12/2011 | Yuan et al. |
| 2012/0222741 | A1 | 9/2012 | Davies et al. |
| 2012/0305053 | A1 | 12/2012 | Sekimoto et al. |
| 2012/0318350 | A1 | 12/2012 | Sakai et al. |
| 2012/0319157 | A1 | 12/2012 | Ichuo et al. |
| 2013/0081685 | A1 | 4/2013 | Nishimura et al. |
| 2013/0084675 | A1 | 4/2013 | Terakawa |
| 2013/0098432 | A1 | 4/2013 | Lim et al. |
| 2015/0083203 | A1 | 3/2015 | Kim et al. |
| 2015/0284875 | A1 | 10/2015 | Veirman et al. |
| 2016/0108549 | A1 | 4/2016 | Kellerman et al. |
| 2017/0051430 | A1 | 2/2017 | Sun et al. |
| 2017/0207354 | A1 | 7/2017 | Lee et al. |
| 2018/0013021 | A1 | 1/2018 | Kai |
| 2018/0138334 | A1 | 5/2018 | Lee et al. |
| 2018/0347071 | A1 | 12/2018 | Kimbel |
| 2018/0355509 | A1 | 12/2018 | Samanta et al. |
| 2019/0006534 | A1 | 1/2019 | Fujita et al. |
| 2019/0161888 | A1 | 5/2019 | Masada et al. |
| 2022/0145494 | A1* | 5/2022 | Greenlee ................ C30B 31/10 |
| 2022/0325438 | A1* | 10/2022 | Appel ..................... C30B 29/06 |

FOREIGN PATENT DOCUMENTS

| | | |
|---|---|---|
| JP | 10558788 A | 3/1993 |
| JP | 2001267610 A | 9/2001 |
| JP | 2003258287 A | 9/2003 |
| JP | 2012520563 A | 9/2012 |
| JP | 2015532529 A | 11/2015 |
| KR | 100783440 B1 | 12/2007 |

OTHER PUBLICATIONS

S. Spiga et al., "Denuded zone and diffusion length investigation by electron beam induced current technique in intrinsically getterd Czochralski silicon," Journal of Applied Physics, Feb. 1, 1999, pp. 1395-1400, vol. 85, No. 3.

EPO, Extended European Search Report for EP Application No. 20852624.4, dated Aug. 17, 2023.

* cited by examiner

PRODUCING A RIBBON OR WAFER WITH REGIONS OF LOW OXYGEN CONCENTRATION

CROSS-REFERENCE TO RELATED APPLICATIONS

This application claims priority to the provisional patent application filed Aug. 9, 2019 and assigned U.S. App. No. 62/884,851, the disclosure of which is hereby incorporated by reference.

FIELD OF THE DISCLOSURE

This disclosure relates to production of ribbons or wafers, such as silicon ribbons or wafers used for solar applications.

BACKGROUND OF THE DISCLOSURE

Silicon wafers or sheets may be used in, for example, the integrated circuit or solar cell industry. Previously, cut silicon wafers were made by wire-sawing large silicon ingots or boules made from the Float-Zone process, Czochralski (Cz) process, modified Czochralski process where magnetic fields are used to control oxygen, or a direct cast process. The oxygen profile through the thickness of any cut of some of these as-grown wafers (wafers <2 mm thick) may be negligible. Many times the oxygen profile is nearly uniform across a wafer.

Achieving high performance semiconductor devices for memory, processors, solar cells, or other applications typically require a silicon substrate that exhibits a high minority carrier lifetime (MCL). The majority of silicon substrates used for semiconductor wafers and solar cells today are made by wire-sawing large single-crystal ingots produced by the Cz process. These wafers have significant oxygen concentrations and oxygen-generated defects that can degrade material MCL, such as by one or more the following mechanisms. First, high concentrations of oxygen precipitate can create bulk micro defects (BMDs) that internally getter metallic contamination. For semiconductor integrated circuits, high BMD densities in the device layer close to the surface cause device yield and reliability deterioration due to effects such as gate oxide failure, high leakage currents, and shorts. In solar cells, oxygen precipitates internally getter metallic contamination such that it cannot be removed from the bulk during cell processing. This prevents high bulk MCL needed for solar cell efficiency. In p-type solar cells, high concentrations of interstitial oxygen react with boron doping to form a boron-oxygen complex that also reduces MCL. In n-type solar cells, oxygen can create traps that reduce MCL. Finally, the oxygen precipitates and their corresponding BMDs create stress concentrations that reduce the overall wafer strength and, therefore, cause breakage in downstream processing.

Techniques were developed to reduce oxygen-driven degradation in the material region near the silicon wafer surface. First, manufacturers can dwell a polished Cz wafer at high temperature (>1000° C.) for several hours (e.g., 12-20 hours) in a reducing, inert, or oxidizing ambient (e.g., an argon or an argon and hydrogen atmosphere). These atmospheres can be configured to cause the interstitial oxygen to outgas from the wafer surface to the ambient. The resulting low-oxygen profiles near the wafer surfaces (known as a "denuded zone") is typically 10-80 µm deep on wafers that are over 600 µm thick. The high temperature dwell is then typically followed by a lower temperature dwell designed to control the evolution and behavior of oxygen defects in the remaining wafer bulk. In another variation of forming the denuded zone, manufacturers subject the polished Cz silicon wafers to a Rapid Thermal Process (RTP) for vacancy out-diffusion depleting the vacancies close to the surface. This would result in a denuded zone at the surface during integrated circuit (IC) thermal cycles that is free of oxygen precipitates. For semiconductor devices, it can be desirable to nucleate and grow precipitates in the bulk wafer away from the denuded zone. These defects can internally getter metal contamination away from and maximize the MCL of the denuded zone for optimal device performance. This internal gettering away from the denuded zone may be important because such a high temperature dwell will have high levels of metallic contamination sourced from the environment which would reduce the MCL of the denuded zone if not for the internal gettering.

The non-denuded area (>20%) of the annealed semiconductor wafer can grow large BMDs in the central thickness of the wafer. These BMDs internally getter metallic contamination to the center of the wafer and, thus, ensure low levels of metallic contamination in the denuded zone, but provide low lifetimes in the remaining central wafer thickness. Strong internal gettering in the material bulk via large BMDs is undesirable for solar cells because solar cells require high lifetime material throughout the bulk of the wafer. Although a low-oxygen denuded zone may be beneficial for a solar wafer, the annealing process used to create this zone results in undesirable BMDs and contamination in the wafer bulk that reduce the final bulk material lifetime.

Currently furnace annealing techniques also lead to stress profiles (i.e., breakage) and/or low MCL profiles caused by contamination. An additional reason to not use a standalone annealing furnace is defect creation. A standalone high temperature annealing furnace mechanically touches a wafer during high temperatures. Those touch points have high metallic contamination and generate "slip" or dislocations that locally degrade electrical performance. While this is acceptable for semiconductor wafers that do not use the whole wafer, it is not acceptable for a solar wafer that makes a device from the entire wafer.

Furthermore, creating a denuded zone requires a separate annealing step after formation of the wafer, which is costly and risks adding contamination to the solar wafer. The denuded zone using this process only occurs on one side of the wafer during the anneal.

Another technique to create a low-oxygen layer on a wafer surface is to epitaxially grow a thin, low-oxygen silicon film via chemical vapor deposition techniques. For substrates used to make processors, a few microns (e.g., 0.5-10 µm) of silicon film can be deposited on a relatively thick (>600 µm) single crystal Cz wafer to create low-oxygen surfaces. Epitaxial growth can produce the relatively thick (>10 µm or >20 µm) low oxygen region achieved by thermal annealing, but growing these thicker epitaxial films has a high manufacturing cost and can cause material stress, slip, stacking faults, metallic contamination, and warpage.

Creating low-oxygen regions near the wafer surfaces by either RTP, annealing, or epitaxially growing a thin film on the surface is undesirable for the following reasons. First, creating these wafers requires several process steps (e.g., ingot growth, wire sawing, wafer polishing, chemical etching, and thermal processing or film growth) that uses many expensive tools, a large semiconductor facility footprint, sizeable material consumption, and labor to move the wafers between the different steps. Second, wafers produced from discrete Cz ingots have a range of properties both along and across the ingot. As-grown wafers produced from these discrete Cz ingots exhibit oxygen, dopant, and defect profiles both radially across a single wafer and between different wafers. This as-grown variation can affect the final processed wafer's performance. For example, wafers with a radial profile of defects can reduce the final yield of devices from that wafer. In addition, such radial profiles cannot be corrected for during thermal processing. Finally, to accommodate the large span of as-grown properties, Cz wafers have to be binned and processed at different conditions to achieve the final desired material properties. This binning, recipe modification, and tracking of the specific wafers is both expensive and leads to suboptimal line performance.

Furthermore, it is not desirable or feasible to create the low-oxygen regions in the thin wafers needed for cost-effective solar cells by either annealing, RTP, or epitaxially growing films for the following reasons. First, the extensive annealing process, RTP, and epitaxial film depositions are too expensive for commercially viable solar cell production. Second, away from the low-oxygen denuded region, the long high temperature annealing step would expose the wafer to metallic contamination that would internally getter and, thus, reduce the bulk MCL. A solar cell's performance may require high bulk MCL (not just high surface MCL), so a denuded wafer from annealing or a wafer with a thin epitaxial film would not create the high bulk MCL desired for high cell efficiency. Third, annealing, RTP, or depositing thick epitaxial films on the thin solar wafers (50-300 um) likely would not be possible. Specifically, thin wafers have lower mechanical stiffness and are therefore more susceptible to warping, generation of thermal stress defects, and likely have mechanical breakage issues in solar cell processing. Furthermore, during a long anneal, thin wafers also would generate dislocations or slip that would reduce MCL at the regions supported by a carrier boat or bond to a supporting wafer. RTP processes involve aggressive cooling rates (50 to 100° C./min) which would again result in deleterious thermal stress induced defects in thin wafers.

A single-step, continuous process that directly produces single crystal wafers from polysilicon feedstock with the aspired low-oxygen "denuded zones" near the wafer surface and the corresponding desired bulk defect profiles is highly desirable. Continuous, direct wafer processes that produce net-shaped wafers eliminate many costly downstream process steps (like wire sawing) and can produce wafers with more uniform properties than discrete Cz ingot production. Unfortunately, historic direct silicon wafer processes have not been able to create the full-size single crystal silicon wafers with the desired oxygen profile. Specifically, vertical ribbon processes like Edge-Fed Growth and String Ribbon as well as horizontal substrate processes like Ribbon Growth on Substrate produce multicrystalline wafers. One vertical ribbon process known as Dendritic Web showed ability to make single crystal wafers, however the process could only yield narrow material (approximately 2 inches wide) before becoming unstable. Solar and semiconductor devices require larger wafers (>4 inches) for economic device manufacturing. Directly making single-crystal silicon wafers by epitaxially growing full-size silicon wafers on a porous silicon substrate that is then mechanically separated from the porous substrate has been performed. Unfortunately, this final wafer has a uniform, low oxygen profile through its material thickness that cannot be shaped, which makes it impractical for certain applications. Producing a wafer from epitaxial growth is expensive and subject to MCL-limiting defects like stacking faults and dislocation cascades.

One promising method that has been investigated to lower the cost of materials for solar cells is the floating silicon method (FSM), which is a type of horizontal ribbon growth (HRG) technique where crystalline sheets are pulled horizontally along the surface of a melt. In this method, a portion of a melt surface is cooled sufficiently to locally initiate crystallization with the aid of a seed, which may be then drawn along the melt surface (while floating) to form a crystalline sheet. The local cooling may be accomplished by employing a device that rapidly removes heat above the region of the melt surface where crystallization is initiated. Under proper conditions, a stable leading edge of the crystalline sheet may be established in this region. Formation of a faceted leading edge is not obtained in Cz or other ribbon growth processes, and can add inherent stability to the growth interface.

In order to sustain the growth of this faceted leading edge in a steady-state condition with the growth speed matching the pull speed of the monocrystalline sheet, or "ribbon," intense cooling may be applied by a crystallizer in the crystallization region. This may result in the formation of a monocrystalline sheet whose initial thickness is commensurate with the intensity of the cooling applied. The initial thickness is often on the order of 1-2 mm in the case of silicon ribbon growth. For applications such as forming solar cells from a monocrystalline sheet or ribbon, a target thickness may be on the order of 200 µm or less. This necessitates a reduction in thickness of the initially formed ribbon. This may be accomplished by heating the ribbon over a region of a crucible containing the melt as the ribbon is pulled in a pulling direction. As the ribbon is drawn through the region while the ribbon is in contact with the melt, a given thickness of the ribbon may melt back, thus reducing the ribbon thickness to a target thickness. This melt-back approach is particularly well suited in the so-called Floating Silicon Method (FSM), wherein a silicon sheet is formed floating on the surface of a silicon melt according to the procedures generally described above.

In addition to these benefits, lifetime or other improvements to wafers produced using HRG would be beneficial. Improved techniques to form ribbons or wafers with low oxygen concentration regions are needed.

BRIEF SUMMARY OF THE DISCLOSURE

A method is provided in a first embodiment. A melt, which includes silicon, is provided in a crucible. A ribbon is formed from the melt. The ribbon floats on the melt using a cold initializer facing an exposed surface of the melt. The ribbon is single crystal silicon. The ribbon is pulled from the melt at a low angle off the melt surface. The ribbon is formed at a same rate as the pulling. The ribbon is separated from the melt at a wall of the crucible where a stable meniscus forms. The ribbon has a thickness between a first surface and a second surface from 50 µm to 5 mm after separation from the melt. The second surface faces the melt prior to the separation. The first surface and the second surface are opposite each other. The ribbon includes a first region extending a first depth from the first surface toward the second surface. The first region has a reduced oxygen concentration relative to a bulk of the ribbon.

A speed of the pulling can be from greater than 0.1 mm/s to 7 mm/s. The crucible can have a length in a direction of the forming from greater than 5 cm to 200 cm.

The ambient temperature around the ribbon can be from 1200° C. to 1420° C. during the forming. An atmosphere around the ribbon can have a pressure from 0.01 atm to 5 atm during the forming. An atmosphere around the crucible can include one or more of $H_2$, Ar, He, another inert gas, or a combination thereof during the forming. An atmosphere around the crucible can include a dopant during the forming. In an instance, an atmosphere around the crucible during the forming includes oxygen and water vapor. In another instance, an atmosphere around the crucible during the forming includes phosphorous oxychloride or a chloride gas.

The pulling can transport the ribbon through a plurality of gas zones after the separating. Each of the gas zones exposes the ribbon to a different gas.

The pulling also can transport the ribbon through a first zone and a second zone, wherein the first zone and the second zone operate at different temperatures. Outgassing oxygen occurs in the first zone. In an instance, the first zone operates at from 1200° C. to 1400° C. and the second zone operates at less than 1200° C.

The method can include outgassing oxygen from the first surface of the ribbon while the ribbon is in the melt during the pulling.

The method can include outgassing oxygen from both the first surface and the second surface of the ribbon during the pulling after the separation from the melt.

The forming and pulling can occur continuously to produce a ribbon from 0.2 m to 100 m in length.

The ribbon can have a bulk minority carrier lifetime greater than 100 µs.

The method can include supporting the ribbon during the pulling after the separating using gas flow levitation and/or a mechanical support. The supporting is configured to minimize contamination of the ribbon.

The method can include melting a portion of the ribbon into the melt during the pulling.

The method can include singulating the ribbon into one or more wafers.

A wafer can be produced using the method of the first embodiment. The wafer may be a solar cell or a semiconductor wafer. The wafer may be a square, pseudo-square, rectangle, or circle.

The thickness between a first surface and a second surface can be from 50 µm to 300 µm after separation from the melt.

In an instance, the first surface and the second surface are surfaces with a largest surface area on the ribbon.

The first region can have an oxygen concentration from 0.1 to 8.0 ppma. A bulk of the ribbon can have an oxygen concentration from 8 to 25 ppma.

The first depth may be at least 5 µm. In an instance, the first depth is from 10% to 90% of the thickness. For example, the first depth is from 20% to 90% of the thickness.

The first region can have a reduced concentration of bulk micro defects relative to the bulk of the ribbon.

The method can include a second region extending a second depth from the second surface toward the first surface. The second region has a reduced oxygen concentration relative to the bulk of the ribbon disposed between the first region and the second region. The second region can have an oxygen concentration from 0.1 to 8.0 ppma.

The second depth may be at least 5 µm. The first depth and the second depth combined can be from 10% to 90% of the thickness. In an instance, the second depth is approximately 10% of the thickness. The first region and the second region can have a reduced concentration of bulk micro defects relative to the bulk of the wafer disposed between the first region and the second region. The first depth and the second depth may be different distances.

The ribbon can further include a dopant.

The ribbon can have an average oxygen precipitate count from 0 to $1e11/cm^3$ in the first region.

A ribbon can be produced using the method of the first embodiment.

An apparatus can be used to perform the method of the first embodiment.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
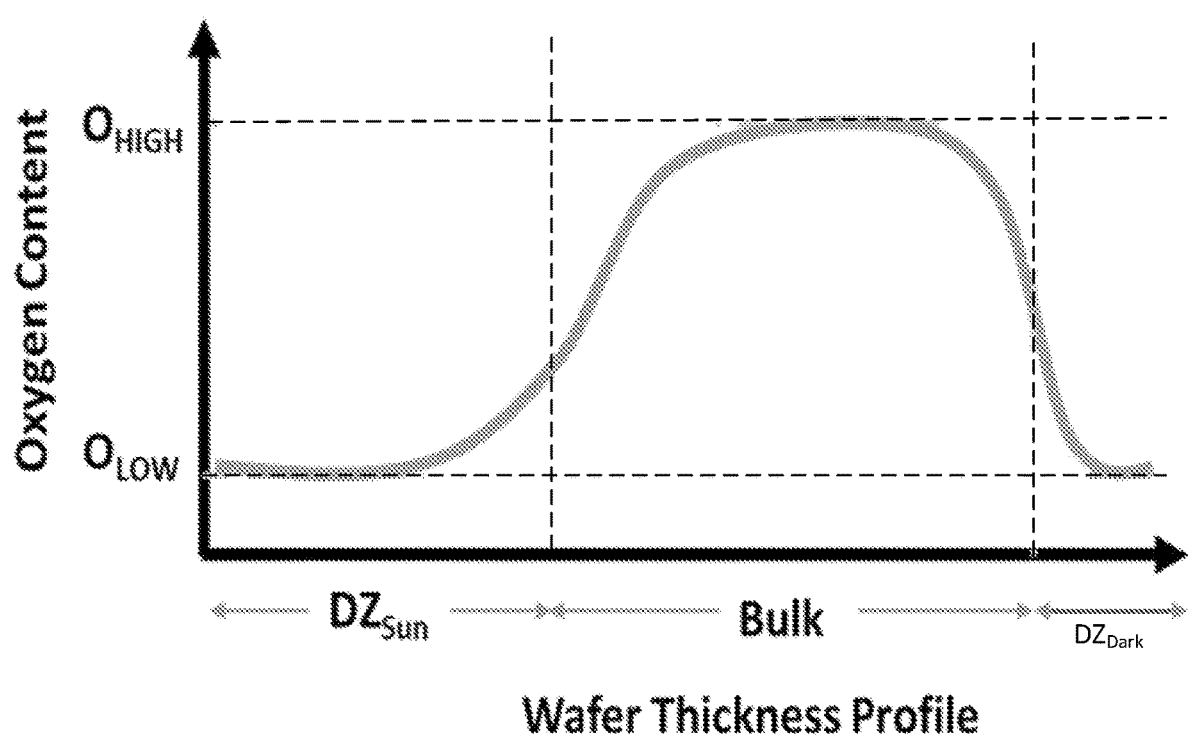
FIG. 1 is a chart of profile of a wafer with an asymmetric, front and back denuded zone profile in accordance with the present disclosure, wherein both the front and back denuded zones ($DZ_{Front}$ and $DZ_{Back}$) are characterized by having low near surface oxygen content ($O_{Low}$) compared to the bulk oxygen content ($O_{HIGH}$)

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

It would be beneficial for semiconductor devices to be made with silicon material that exhibits low oxygen content especially in the material regions near the wafer surfaces where the device is made or (in the case of solar cells) where the most sunlight is absorbed. Oxygen precipitation and the BMD counts scale directly with bulk oxygen content, and below critical concentrations there is negligible precipitation. Furthermore, for a given oxygen concentration, the thermal processing of the wafer can be used to control precipitation, control BMD densities, and minimize the deleterious effects of oxygen. The boron-oxide degradation mechanism can scale with the square of the interstitial oxygen concentration.

The embodiments disclosed herein present for a single step process that directly produces single crystal wafers with a denuded zone and tailored defect profile that overcomes the cost and quality limitations of the present multi-step process to produce annealed Cz wafers. A ribbon is continually produced from a melt that is continuously fed with polysilicon, and the as-grown ribbon that exits the tool has the desired low-oxygen profiles from the wafer surfaces and corresponding low BMDs. The atmosphere and temperature profile around the produced ribbon can be controlled to increase the depth of the low-oxygen concentration region from the ribbon surface. This ribbon is later singulated or otherwise separated into individual wafers that are then polished and further processed into semiconductor devices, solar cells, and other silicon devices like battery anodes.

In the embodiments disclosed herein, a silicon melt in a quartz crucible sources oxygen to the ribbon. This crucible can be made from high purity quartz such that it reduces metallic contamination to the melt. Further, to improve its longevity in the melt and provide a desired dissolution rate, the crucible walls can be coated with various materials like silicon nitride and barium oxide. Other coatings also can be used. The heat to maintain the melt at a temperature near the silicon's melt temperature can be provided by resistive heaters or other heating methods.

The melt level can be maintained by the continuous feeding of new polysilicon feedstock to the melt to replenish as solid ribbon material is extracted. Feedstock can be either solid chips or granules or liquid silicon melt. This feedstock material can be doped to maintain a target resistivity profile in the produced ribbon as more wafers are pulled and segregation results in dopant buildup. Dopants can include but are not limited to boron, phosphorous, gallium, germanium and antimony. The melt can also be doped with nitrogen to increase wafer mechanical strength. This process optionally can have another feed that incrementally removes silicon melt from the crucible. This melt extraction feature could reduce the buildup of metallic contaminants in the melt that would translate to buildup of metallic contamination in the ribbon. The heat to melt the feedstock can be provided by resistive or other heaters.

A mechanical system continuously pulls the ribbon and singulates discrete wafers from the ribbon inline. Continuous feedstock replenishment and doping overcomes the shortcomings of Cz crystal growing where a discrete melt volume produces an ingot with a resistivity span because of dopant buildup. In addition, continuous feedstock replenishment results in continuous dilution of metallic buildup and lower metallic concentration (and, hence, higher MCL) in wafers compared to batch Cz process. Furthermore, continuous production of silicon wafers with a constant melt height and thermal profile reduces the variation of oxygen and defect profiles between wafers. Growing and doping continuously can therefore reduce material binning and increase the overall performance on downstream processing.

Figure 8:
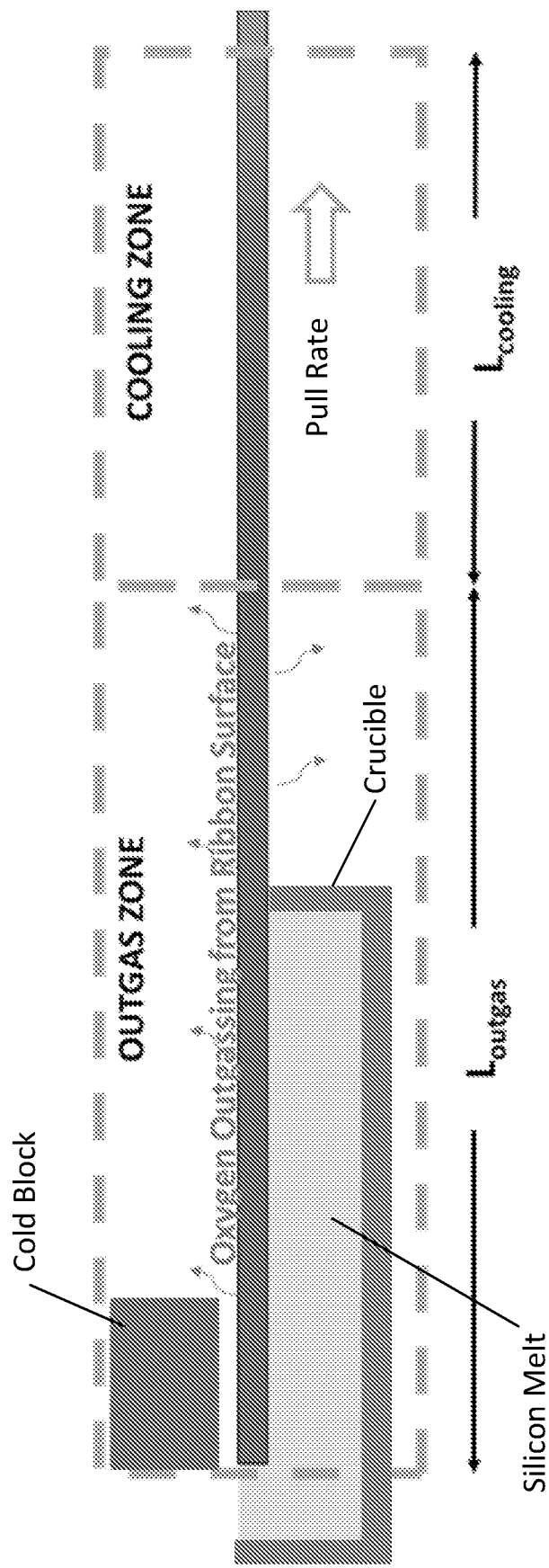
FIG. 8 is an exemplary cross-section of a system illustrating production of a ribbon with denuded zones and tailored defects.

A solid ribbon is initially formed on the melt surface by extracting heat from the leading-edge ribbon interface with a cold initializer and then pulling this solidified ribbon horizontally across the melt surface towards the crucible edge, as shown in FIG. 8. The cold initializer may use one or more of radiation, advection, and convection to cool the silicon surface. The silicon ribbon floats on the surface of its melt and does not inherently require other means of support within the melt. For example, the cold initializer may be a cold block with or with a cooling jet. The length of this cold initializer roughly defines the width of the ribbon and the magnitude of cooling define the ribbon's as-grown preliminary thickness. The ribbon width may be between 2 cm to 50 cm (e.g., from 5 cm to 50 cm). Ribbons intended for semiconductor manufacturing may be over 300 mm wide, and ribbons intended for solar cell manufacturing may be over 156 mm wide for standard cell processing. Heat extraction from the ribbon surface to the cold initializer can be through either radiative cooling, advection to a cooling gas, and/or convection between the cold initializer and the ribbon surface with high gas flow. One example of a cold initializer and advective cooling is to direct an impinging jet of high thermal conductivity gas like helium, hydrogen, or other inert gases. By directly forming a ribbon or sheet of silicon, the created wafer properties are not subject to having radial defect profiles as is the case with Cz wafers that are formed from cylindrical ingots. Furthermore, the defect profiles from the center to the wafer edge are more uniform than Cz wafers. This use of a linear cold initializer to create approximately linear thermal conditions can enable more homogenous material properties.

To stabilize the leading-edge solidification interface near the cold initializer, this process optionally has local heating of the melt near the solidification region. This can create the thermal conditions needed to stably grow a wide, single crystal ribbon at a given pull rate. Locally heating the melt near the ribbon's leading-edge solidification interface can help stabilize the crystal growth interface at given pull rates. The resulting thermal profile in the melt around the ribbon can also be tailored to accommodate and stabilize the ribbon edges that may be more susceptible to growth instability.

While the grown ribbon is then pulled across a melt surface, the ribbon thickness can be either increased or decreased from its original, as-grown thickness (as created by the cold block) to a target, desired thickness profile. This process can produce ribbons between 25 µm and 5 mm thick. Ribbons made for semiconductor device manufacturing may be over 600 µm thick, and ribbons made for solar cell manufacturing may have a thickness approximately 160 µm or more, though other thicknesses are possible. For example, increasing the melt temperature below the floating ribbon melts-back or thins the ribbon's thickness profile. Another example is that the radiative surfaces above the floating ribbon can be lowered below silicon's melt temperature to further extract latent heat from the ribbon surface and, thus, increase its thickness. The temperature of the melt or local radiative elements can be between 1300° C. and 1600° C. The silicon melt temperature can be 1414° C. or more. The thermal profiles created in the melt or in the radiative furnace can be further shaped to also locally sculpt the final wafer thickness profile. For example, thicker ribbon edges can be locally created (for increased handling strength) or the final ribbon thickness profile can be smoothed such that a target thickness profile needed for processing is achieved with minimal post-process polishing to achieve thickness uniformity targets. Any growth thickness non-uniformities can be smoothed out using spatially independent multiple submerged melt back heaters. Beyond controlling either the melt temperature or temperature of other elements in the furnace, the final ribbon thickness profile can be controlled by either increasing the crucible length or adjusting the pull rate. The combination of the length and pull rate can govern the time the ribbon remains in contact with the melt. The ribbon is floating on the surface of the melt during the pulling.

Figure 2:
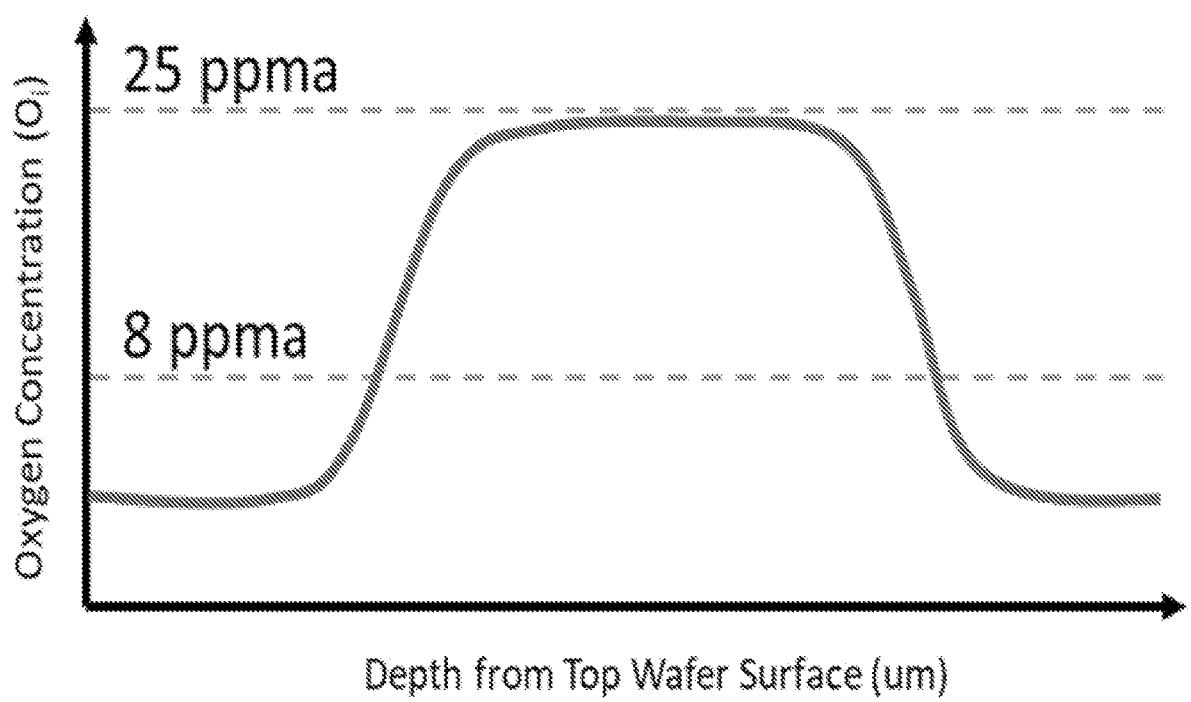
FIG. 2 illustrates an embodiment of an oxygen profile in accordance with the present disclosure.

Embodiments disclosed herein can form a silicon wafer from the ribbon that exhibits the following combination of highly desirable material properties for a high-efficiency solar cell. A thin (50-300 µm), single-crystal silicon wafer with low-oxygen concentration profiles extending from one or both of its surfaces can be formed, as shown in FIG. 1 or FIG. 2. These low-oxygen regions can exhibit a total oxygen concentration of less than 8 ppma and make-up 5%-90% of the total wafer thickness (e.g., 10%-90% of the total wafer thickness or greater than 20% to 90% of the total wafer thickness). The remaining bulk wafer oxygen concentration away from the low-oxygen zone may be from 8 ppma to 25 ppma oxygen. These low-oxygen regions may be as large as possible to minimize the aforementioned oxygen-driven solar cell degradation mechanisms. The low-oxygen regions can extend from the light-facing, rear, or both surfaces and can be symmetric or asymmetric. In an instance, the lowest oxygen profiles extend from the wafer surface that faces the sun because it absorbs the majority of the light and has the highest impact on final solar cell efficiency. In another instance, a low oxygen region extends from the wafer surface not facing the light (i.e., rear surface) because that is where solar cell features are located. Shallower low-oxygen depths may be used because the process conditions that create deeper low-oxygen profiles may also result in more contamination. Furthermore, shallower low-oxygen depths may be beneficial because interstitial oxygen can improve the mechanical strength of wafers by offering slip resistance. Nitrogen doping can be used to counter the lost mechanical strength resulting from reduced oxygen concentrations without affecting electrical performance. Shallower low-oxygen depths with higher bulk oxygen may also be beneficial for internal gettering applications for semiconductor devices.

Figure 3:
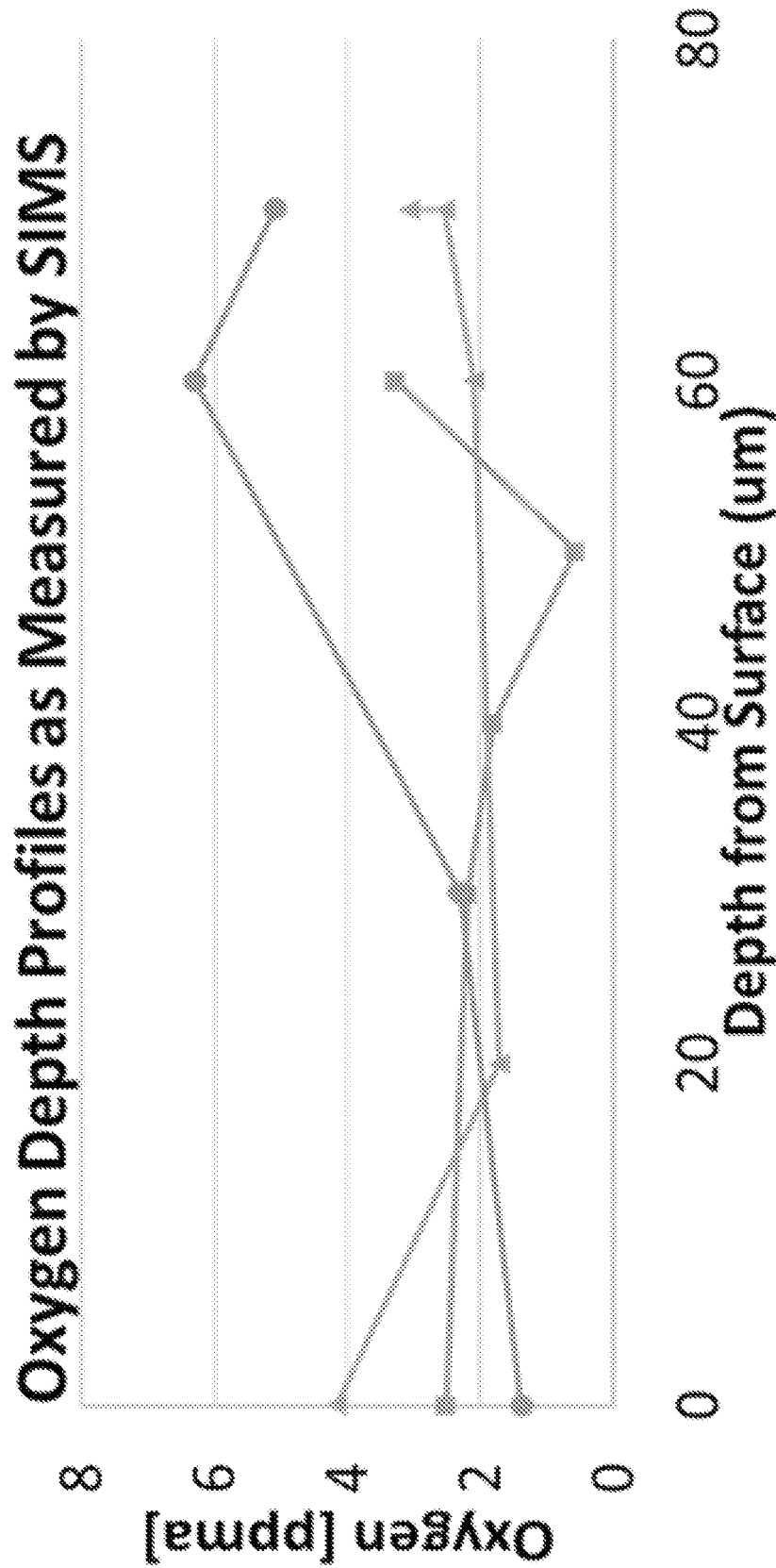
FIG. 3 illustrates a SIMS measurement of an exemplary wafer.

A wafer exhibiting a denuded zone or low-oxygen region through a large fraction of the wafer thickness is different from previous wafers where only a relatively thin top layer of the wafer exhibits low oxygen. Providing a low oxygen profile through a larger fraction of the thickness provides benefits for solar cell devices because the final efficiency depends on the bulk material properties rather than the quality the material near the wafer surface, such as with semiconductor devices. Semiconductor device performance generally depends on the material properties of only the top 80 µm or less and not the bulk material properties like with solar cell performance. FIG. 3 shows measured oxygen concentration as a function of depth from the wafer surface as measured by SIMS. The corresponding bulk oxygen concentration of these profiles was over 15 ppma as measured by FTIR. These measured profiles can be representative of both wafer sides.

Figure 4:
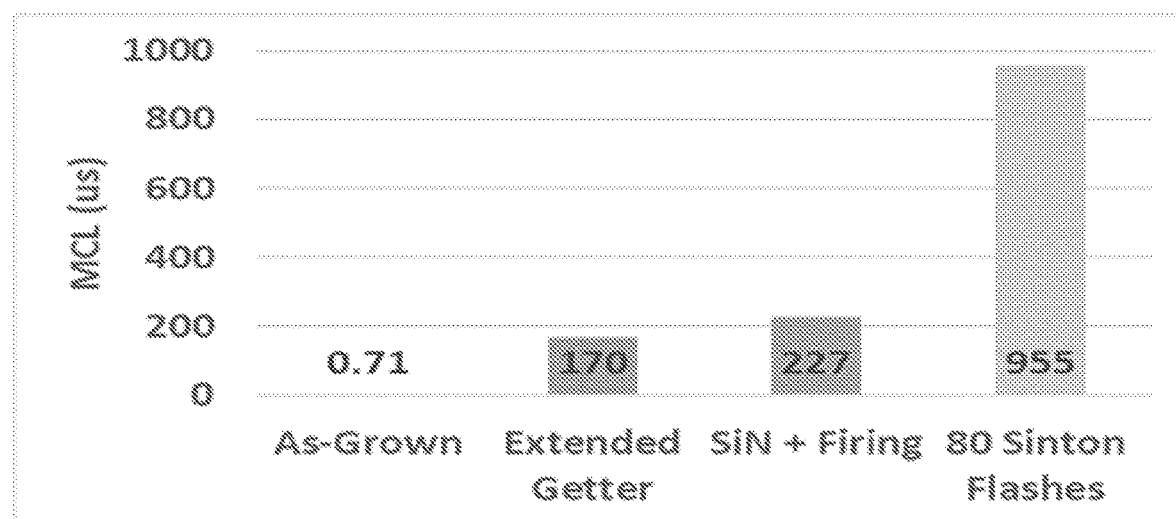
FIG. 4 illustrates measured MCL of an exemplary wafer during the different stages of solar cell processing where the lifetime increases from <1 µs to 955 µs.
Figure 5:
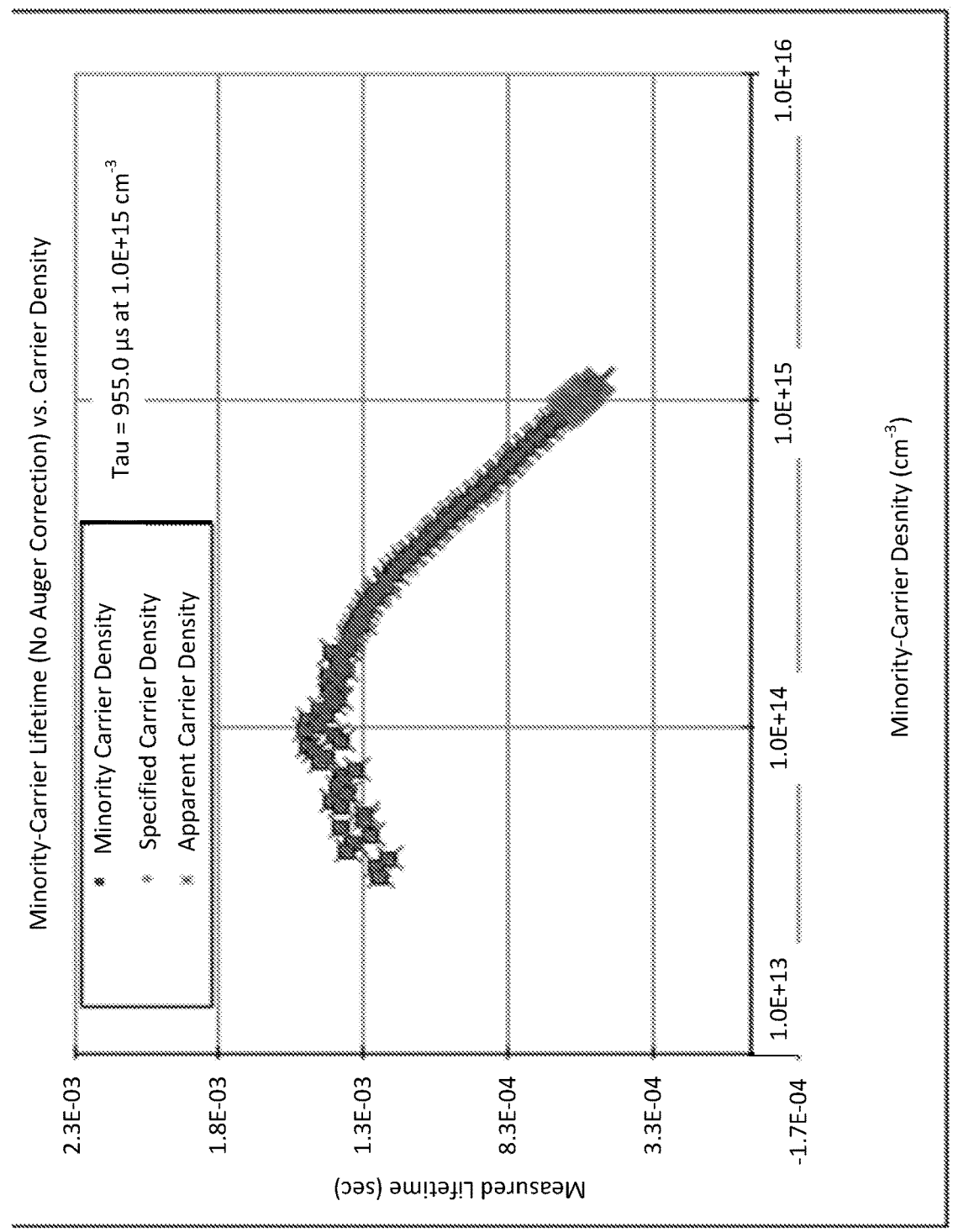
FIG. 5 illustrates the final measured bulk MCL of the wafer after solar cell processing.

This thin wafer with the disclosed oxygen profiles also can exhibit a final bulk MCL in the final solar cell device that is higher than 100 µs at the material resistivity for typical solar cells. As the final solar cell efficiency depends on the combination of the MCL and resistivity, this 100 µs MCL is measured on a wafer doped to a resistivity between 0.1 ohm-cm and 10 ohm-cm. Current p-type solar cells currently use doping between 0.5 ohm-cm to 3 ohm-cm, and n-type solar cells currently use doping between 2 ohm-cm and 6 ohm-cm. The doping material can be boron, gallium, phosphorous, antimony or other known dopants for silicon. Furthermore, this MCL can be measured on a wafer that is made into a solar cell device. Solar cell processing can getter metallic contamination and passivate defects to increase a wafer's as-grown MCL. The disclosed low oxygen profile does not readily generate oxygen precipitates, so the wafer's bulk MCL can increase in solar cell processing as shown in FIG. 4 to give the final measured MCL shown in FIG. 4. The wafer's ability to increase bulk MCL over three orders of magnitude is unlike previous wafers where the oxygen precipitates in the bulk would internally getter metallic contamination and prevent this increase. Embodiments disclosed herein can have bulk oxygen precipitate densities lower than $10^9/cm^3$ for this bulk MCL.

In an embodiment, a method of forming a ribbon is provided. A melt that includes silicon is provided in a crucible. The ribbon, which is single crystal silicon, is horizontally formed on the melt using a cold initializer having a cold initializer surface that directly faces an exposed surface of the melt. The ribbon separates from the melt at the edge of the crucible where a meniscus forms. The ribbon may be lifted approximately 0.2 mm to 2 mm above the crucible edge to enhance meniscus stability. At that point, the ribbon may have a small angle. The resulting ribbon has a thickness from a first surface to a second surface from 25 µm to 5 mm (e.g., 50 µm to 5 mm or 50 µm to 300 µm). The first surface and the second surface are opposite each other. The first surface and the second surface may be outer surfaces of the ribbon. The ribbon includes a first region extending a first depth from the first surface. The first region has a reduced oxygen concentration relative to a bulk of the ribbon. The ribbon has a minority carrier lifetime greater than 100 µs.

In an instance, a speed of the pulling is from greater than 0.1 mm/s to less than 15 mm/s (e.g., 0.1 mm/s to 7 mm/s), including all values to the 0.1 mm/s and ranges in between. For example, the pull speed can be 10 mm/s. The speed of the pulling can affect vacancies in the ribbon.

The crucible can have a length in a direction of the horizontal forming or the ribbon pulling from greater than 5 cm to less than 2 m (e.g., 1 m or 200 cm), including all values to the 1 cm and ranges in between. For example, the crucible may be less than 0.5 m in length.

An atmosphere around the ribbon during the forming may include one or more of $H_2$, Ar, He, another inert gas, or a combination thereof to control oxygen defects or create additional material performance. The atmosphere around the crucible during the forming also can include oxygen and water vapor, phosphorous oxychloride, or another chloride gas. The atmosphere may be at a positive pressure. $N_2$ may be added in the atmosphere around the ribbon during the forming as a strengthening agent. Dopants, such as those including boron (e.g., boron trifluoride or diborane), arsenic (e.g., arsine), or phosphorus (e.g., phosphine), also can be added in the atmosphere around the ribbon during the forming. Pressure around the ribbon and/or crucible can be 0.01 atm to 5 atm (e.g., from 0.01 atm to 1.5 atm).

The forming and pulling can occur continuously. For example, the forming and pulling can produce a ribbon from 0.2 m to 100 m or more in length with a width from 2 cm to 50 cm. The ribbon can be singulated (e.g., sliced) into one or more wafers. These wafers can be used to manufacture, for example, solar cells or semiconductor wafers.

The ambient temperature around the ribbon can be from 1200° C. to 1420° C. during the forming. The temperature may be below 1400° C. after the ribbon leaves the melt.

In an instance, the pulling can transport the ribbon through a plurality of gas zones. Each of the gas zones exposes the ribbon to a different gas.

In another instance, the pulling transports the ribbon through a first zone and a second zone. The first zone and the second zone operate at different temperatures. Outgassing oxygen occurs in the first zone. For example, the first zone can operate at from 1200° C. to 1400° C. and the second zone can operate at less than 1200° C.

Oxygen can outgas from the first surface of the ribbon while the ribbon is in the melt during the pulling. Oxygen can outgas from both the first surface and the second surface of the ribbon after the ribbon is removed from the melt during the pulling.

The embodiments disclosed herein use a one step process to form a ribbon with the desired first region and second region present in the ribbon during its formation. This avoids a second annealing step or other additional manufacturing steps, which saves time and reduces production costs.

A denuded zone is a term typically used by the semiconductor industry to describe a low-oxygen zone of a wafer surface purposefully created for better electronic properties. The denuded zone is characterized by having low oxygen and reduced defects. The denuded zone is formed during annealing because the interstitial oxygen in the wafer diffuses to the wafer surface and outgases to the annealing atmosphere. The depth of the denuded zone scales with the square root of the diffusion coefficient of oxygen and time. In an HRG process, the wafer surface outgases oxygen while it is traveling on the melt and after it separates from melt surface. In this ribbon process, a deep denuded zone may take only minutes to form because the diffusion of oxygen is faster at the melt temperature (e.g., 1412° C.).

A wafer or ribbon is disclosed, which can be used for solar, semiconductor, or other applications. The wafer can include silicon, but also can include or be fabricated from germanium, gallium oxide, sapphire, and/or other materials. The wafer or ribbon may be single crystal with (100), (110), or (111) orientation. Dopants or other additives, such as phosphorous, boron, gallium, arsenic, indium, germanium, antimony, aluminum, bismuth, lithium, or nitrogen, also may be incorporated into the wafer or ribbon.

In an instance, the ribbon has a thickness from a first surface to a second surface from 50 µm to 5 mm (e.g., 50 µm to 1 mm) after separation from the melt, including all values to the 1.0 µm and ranges in between. The first surface and the second surface are opposite each other. In an embodiment, the thickness of the ribbon or wafer is from 50 µm to 950 µm. In another embodiment, the thickness of the ribbon or wafer is from 50 µm to 600 µm or from 50 µm to 300 µm. The first and second surfaces may be surfaces of the ribbon that have the largest surface area on the ribbon and may be flat or textured. The wafer singulated from the ribbon may be a square, pseudo-square, rectangle, or circle. Circular wafers can include a flat at the edge.

For solar cell applications, the thickness of the ribbon 100 may be from 50 µm to 300 µm after separation from the melt. The silicon substrate may be at least 50 µm thick to absorb a sufficient fraction of the incoming solar spectrum. Silicon substrates thicker than 300 µm may require additional processing time for gettering and more feedstock material. The ribbon may be single crystal to avoid grain boundaries because grain boundaries can reduce cell efficiency and/or mechanical strength.

Figure 6:
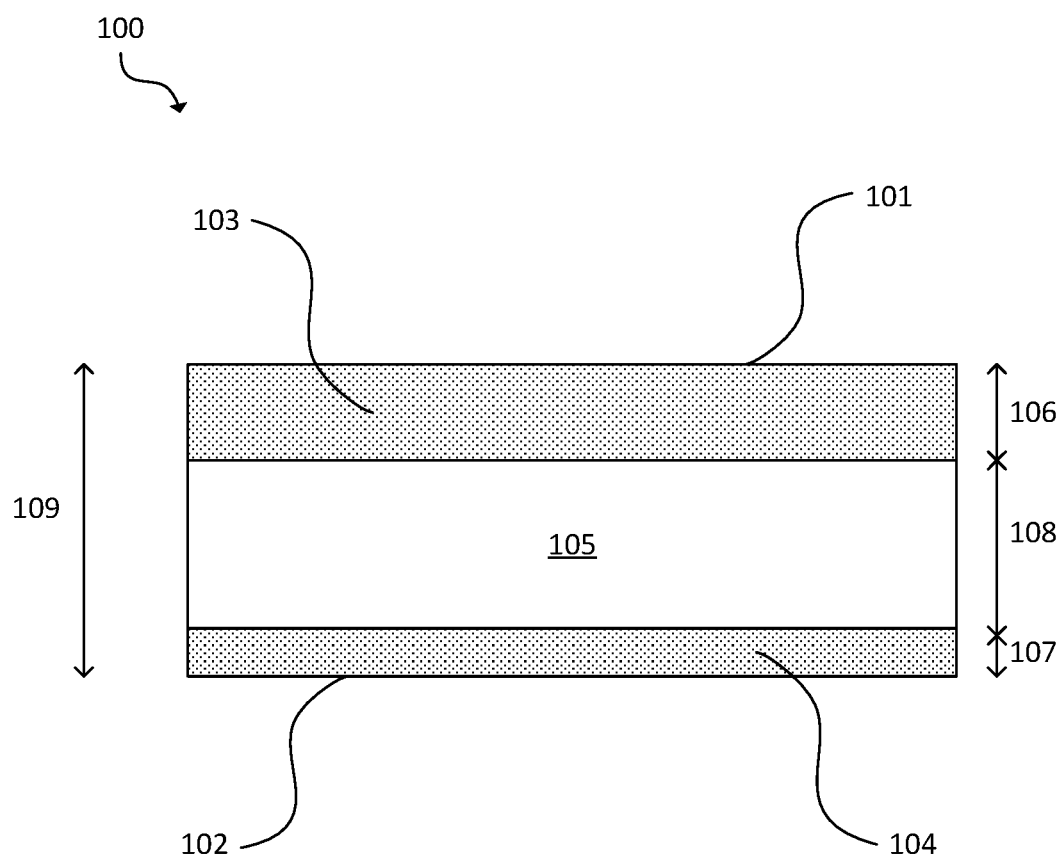
FIG. 6 is a cross-sectional view of an exemplary wafer in accordance with the present disclosure.

The ribbon 100 can include a first region 103 extending a first depth 106 from the first surface 101 and a second region 104 extending a second depth 107 from the second surface 102, such as shown in FIG. 6. The first region 103 and the second region 104 are examples of denuded zones. The first surface 101 and second surface 102 can be outer surfaces of the ribbon 100. The first region 103 and the second region 104 have a reduced oxygen concentration relative to a remainder of the ribbon disposed between the first region and the second region (i.e., the center bulk 103 with a thickness 108). The first region 103 and the second region 104 are denuded zones. In an instance, the first region 103 and the second region 104 have an oxygen concentration from 0.1 to 8.0 ppma, including all values to the 0.1 ppma and range in between. The first region 103 and/or the second region 104 have an oxygen concentration from 0.1 to 7.0 ppma, 0.1 to 5.0 ppma, 0.1 to 3.0 ppma, 0.1 to 2.0 ppma, or 0.1 to 1.0 ppma. By having a low oxygen concentration in the first region 103 and at the first surface 101, the highest quality, best performing material can be used where most electrical activity occurs in a solar cell.

Wafers for solar cells may have a bulk oxygen content range from 8 ppma to 25 ppma in a region between the first region 103 and the second region 104 (i.e., the bulk region 105), such as directly adjacent to the first region 103 or second region 104 or in the center of the ribbon 100. Silicon with bulk oxygen content above 8 ppma can form defects that reduce the final solar cell efficiency. In boron-doped material, oxygen can bond with the boron to form complexes that reduce lifetime. This mechanism is often referred to as light-induced degradation. Silicon can be brittle, and interstitial oxygen can increase wafer mechanical robustness via dislocation pinning and locking. Wafers with oxygen content below 1 ppma can be fragile and may have high breakage rates during processing. Semiconductor and other applications can have a larger oxygen content than solar cells.

The first depth 106 and the second depth 107 can vary in dimension and may be different from each other. The first depth 106 and the second depth 107 may be at least 5 µm. In an instance, the first depth 106 is at least approximately 10% of the thickness 109 of the ribbon 100 and may be up to 90%, including all values to the 1% and ranges in between. In another instance, the first depth 106 is approximately 30% of the thickness 109 of the ribbon 100. In yet another instance, the first depth 106 is from approximately 10% to approximately 50% of the thickness 109 of the ribbon 100, including all values to the 1% and ranges in between. In an instance, the second depth 107 is approximately 10% of the thickness 109 of the ribbon 100. The first depth 106 and the second depth 107 combined may occupy between 10% and 90% of the thickness 109 of the ribbon 100, including all values to the 1% and ranges in between. Thus, the sum of the distance of the first depth 106 and the distance of the second depth 107 may be from 10% to 90% of a total thickness 109 of the ribbon 100.

The first region 103 and the second region 104 can have a reduced concentration of BMDs relative to the remainder of the ribbon 100 disposed between the first region 103 and the second region 104 (i.e., the bulk region 105). In an instance, the first region 103 and the second region 104 have no bulk micro defects. The reduced concentration of BMDs also can exist in the non-denuded region (e.g., the bulk region 105 between the first region 103 and the second region 104).

For solar cells, a BMD count from $0/cm^3$ to $1e11/cm^3$ may be present in the first region 103 and the second region 104. High oxygen in combination with internal structural defects can precipitate oxygen clusters (e.g., BMDs) that act as internal gettering sites for metallic impurities. Wafers with BMDs can result in lower solar cell efficiency. High BMD counts and other structural defects can reduce wafer mechanical strength and lead to solar cell breakage. Semiconductor and other applications can have a larger BMD counts than solar cells. There may be a higher concentration of BMDs in the non-denuded region (i.e., in the bulk region 105 relative to the first region 103 and the second region 104).

For solar cells, the denuded zone of the first region 103 and/or the second region 104 can extend >20% of wafer thickness. As shown in FIG. 1, a denuded zone (DZ) is characterized by having no BMDs, lower oxygen concentration than the bulk, and no excess of vacancies or interstitials. Having a fraction of the wafer thickness (e.g., >20%) exhibit a denuded zone is well-suited for having high electrical properties. Lower vacancy counts can occur in the first region 103, the second region 104, and/or the non-denuded region (e.g., the region between the first region 103 and the second region 104).

The first region 103 and the second region 104 can have silicon vacancies. The concentration of the vacancies can depend on the crystal pulling speed and the thermal gradient across the growth front during formation using the system of FIG. 7 or FIG. 8.

The bulk minority carrier lifetime (MCL) of a wafer produced for solar cells may be greater than 100 µs and/or less than or equal to 50000 µs, including all values to the 1.0 µs and ranges in between, when measured in the final solar cell device after material processing. MCL is how long an excited electron remains in the conduction band and influences solar cell efficiency. For high efficiency solar cells, the MCL may be greater than 100 µs. For wafers produced for semiconductor devices, the bulk MCL may be much lower (<1 µs) because of it is desired to have oxygen precipitates for internal gettering in semiconductor device manufacturing.

While disclosed with both a first region 103 and a second region 104, certain ribbons may only have a first region 103 with reduced oxygen concentration.

For solar cells, having a denuded zone on at least the sun-facing side (where most of the light is absorbed) of the wafer is beneficial. It also can be helpful to have a denuded zone on the dark-side of the wafer. The respective size of the front and back denuded zones may be tailored to both maximize electrical performance for a given solar cell architecture and to enable sufficient mechanical strength. Mechanical strength can correlate with oxygen content. FIG. 1 shows an example of a wafer that exhibits both front and back denuded zones of differing size. Note both the magnitude of oxygen content in the denuded zone and the bulk, along with the wafer thickness.

Table 1 lists exemplary material properties for a ribbon or wafer. Table 2 lists additional properties that the ribbon or wafer may exhibit. The properties of Table 1 are exemplary and other values or properties are possible.

TABLE 1

Ribbon material properties

| Property (units) | Range |
| --- | --- |
| Average Thickness (µm) | 50-300 |
| Microstructure | Single crystal |
| Crystal Orientation | (100) |
| Bulk Minority Carrier Lifetime for Solar Wafers (µs) | >100 |
| Bulk Minority Carrier Lifetime for Semiconductor Wafers (µs) | <100 |
| Bulk Oxygen Content ($O_{HIGH}$, ppma) | 8-25 |
| Denuded Zone Oxygen Content ($O_{LOW}$, ppma) | 0.1-8 |
| Fraction of the Wafer Thickness with Denuded Zone (%) | 5%-90% |
| Front Side/Sun-Side Denuded Zone Thickness Fraction (%) | 5%-90% |
| Back Side/Dark-Side Denuded Zone Thickness Fraction (%) | 0%-30% |
| Average Oxygen Precipitate Count (count/cm$^2$) | 0-1e16/cm$^3$ |

In Table 1, the first region 103 is the sun-side denuded zone and the second region 104 is the dark-size denuded zone.

Average thickness can be measured using calipers, micrometers, laser scanning or other techniques. Crystal orientation can be measured using, for example, XRD. Microstructure can be measured using XRD, visual inspection, or other techniques. Bulk minority carrier lifetime can be measured by Sinton QSSPC, u-PCD, or other techniques. Average minority carrier lifetime can be measured on a wafer passivated by iodide-ethanol or other materials that has been processed into a solar cell. Bulk oxygen content can be measured using, for example, FTIR. The oxygen content, fraction of wafer thickness with the denuded zone, or thickness fractions can be measured using SIMS, FTIR, or other techniques.

The ribbon or wafer can be doped with silicon dopants, which include phosphorous, boron, gallium, arsenic, indium, germanium, or other materials. Thus, the resulting wafer can be p-type or n-type.

The ribbon or wafer can have a nitrogen level from 1e13/cm$^3$ to 1e15/cm$^3$, which can be measured in atm/cm$^3$. Nitrogen can be diffused into the ribbon or wafer. Nitrogen concentrations in this range can be used to increase mechanical performance.

Hydrogen also can be diffused into the ribbon or wafer. Diffusing in hydrogen to the final wafer can reduce electrical activity of recombination centers.

The finished wafer surfaces can be polished or can have different textures. For increased light capture and/or enhanced surface passivation, at least the front of solar cells can be textured. A non-exhaustive list of possible wafer surfaces include the formation of surface pyramids via chemical etching, the formation of silicon nanowires (known as black silicon) through a wet chemistry, or a honeycomb pitting structure via reactive ion etching. The back of the cell can also be textured, but in some cell architectures it can be either untextured or polished to a minimal roughness.

The finished wafer can include device modifications, such as lasered holes, barcodes, or selective doping profiles. To create a device, the wafer is often mechanically or electrically altered. Some examples include either lasering holes through the bulk of the wafer, selectively doping different regions of the wafer, or marking the surface for wafer tracking. These modifications do not change the other benefits of denuded zones. While these modifications can physically change a wafer, these modifications do not change the other benefits of denuded zones.

Total thickness variation can be from <0.5 µm to 100 µm. The wafer's total thickness variation may affect cell processing steps like contact firing. Some cell architectures leverage different thickness profiles to achieve different features.

The resulting wafer may be square, pseudo-square, rectangular, circular, or other shapes. For example, the final wafer can be rectangular, square, or circular with critical dimensions (length or diameter) ranging from 1 inch to 18 inches (e.g., 12 inches).

The description herein is not exhaustive of all the different processing steps or additional wafer features needed to create solar, semiconductor, or other devices. Other steps or specifications are possible.

The final wafer in the solar cell device can exhibit specific geometries or material properties for the production of a solar cell. These features do not generally affect the low-oxygen profiles disclosed herein or obscure the final high MCL measured in a finished solar cell that results from the disclosed minimization of oxygen-driven MCL degradation.

In FIG. 2, oxygen concentration profile is shown as a function of depth from the top wafer surface. Specifically, there can be a low-oxygen region (<8 ppma) of a particular thickness on one or both wafer surfaces. As seen in FIG. 3, this oxygen depth profile was measured from the top surface of produced wafers which may be desirable to minimize oxygen-driven solar cell degradation mechanisms.

Embodiments disclosed herein are different from cut Cz wafers because the disclosed wafers have a different oxygen profile through the wafer thickness. A profile with a low oxygen concentration near the surfaces and a high oxygen concentration deeper in the bulk cannot be made by directly cutting an ingot.

In a particular embodiment, a thin wafer (e.g., <300 um) is used for a solar cell. A fraction (>10%) of the wafer thickness exhibits low oxygen to avoid lifetime degradation mechanisms. Zero to low fractions of BMDs may be present to avoid internal gettering that results in low lifetime wafers (<100 μs). Solar cell processing can getter metallics to the wafer surface away from the wafer center. BMDs can generate residual stresses that increase the breakage of thin wafers used for solar cell processing, such as by reducing the concentration of interstitial oxygen in the wafer.

Asymmetric oxygen profiles also can be formed. Decoupled denuded zones can provide control over the oxygen profile that enables a high final wafer strength and tailored electrical properties. Decoupled denuded zones can be formed without excess wafer breakage or the cost of additional processing steps.

The wafers disclosed herein can be made using an FSM process. A system for FSM ribbon production, such as that illustrated in FIG. 7 or FIG. 8, can include a crucible for housing a melt and a cold initializer having a cold initializer surface that directly faces an exposed surface of the melt. The cold initializer is configured to form a ribbon floating on the surface of the melt at the same rate it is pulled. During operation a melt is provided in the crucible. The thickness of the ribbon is controlled in a melt-back zone before the ribbon separates from the melt at the crucible wall where a stable meniscus forms.

Figure 7:
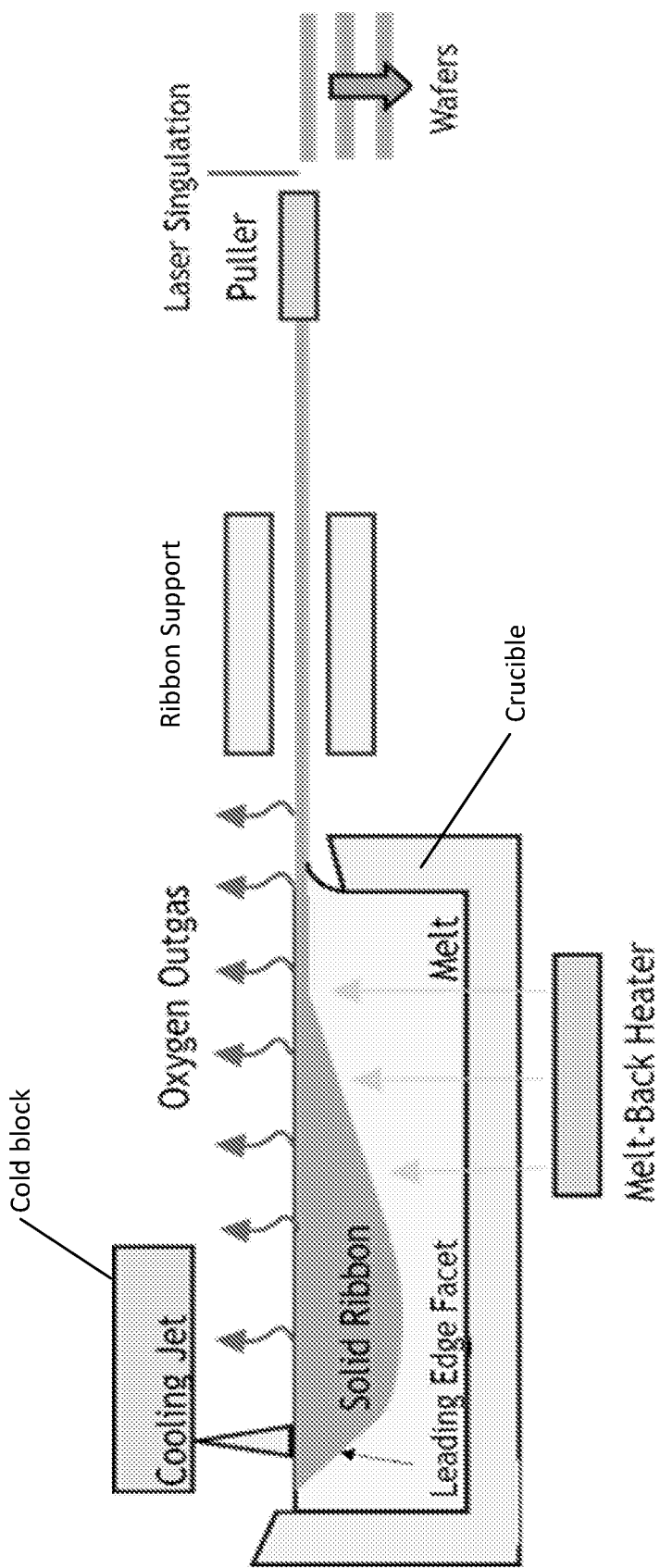
FIG. 7 is an exemplary cross-section of a system in accordance with the present disclosure for producing a wafer.

A system for wafer production, such as that illustrated in FIG. 7 or FIG. 8, can include a crucible for housing a melt and a cold block having a cold block surface that directly faces an exposed surface of the melt. The cold block is configured to generate a cold block temperature at the cold block surface that is lower than a melt temperature of the melt at the exposed surface whereby a ribbon is formed on the melt. The cold block also can provide a cooling jet to assist in formation of the solid ribbon. During operation a melt is provided in the crucible. A ribbon is formed horizontally on the melt using the cold block with a cold block surface that directly faces an exposed surface of the melt. A melt-back heater can reduce a thickness of the ribbon in the melt after it is formed. The ribbon is pulled from the melt at a low angle off the melt surface using the puller. The ribbon may be pulled from the crucible at a 0° angle or at a small angle relative to a surface of the melt (e.g., less than 10°). The ribbon is supported and singulated into wafers, such as using a laser. The wafers made using this system can have the reduced oxygen concentration described herein. Oxygen outgas can occur in the melt or after separation from the melt.

The embodiments disclosed herein can control the ambient environment around the ribbon at high temperatures (e.g., 1200 to 1414° C. or 1200 to 1400° C.) to outgas oxygen from the ribbon's surfaces and create the highly desired low oxygen profiles at the ribbon surfaces. Oxygen outgases from a wafer surface at high temperatures and the rate of outgassing scales by the diffusion coefficient of oxygen in silicon and the atmospheric conditions at the ribbon's surface. Different gas mixtures and the atmospheric pressures can enhance outgassing by increasing the removal rate of diffused oxygen from the ribbon surface. Gas mixtures can include argon, hydrogen, helium, or any other inert gases that may or may not also create a reducing atmosphere that would enhance oxygen removal. Relevant atmospheric pressures include low sub-atmospheric pressures (e.g., 0.01 atm) to positive-pressure systems (e.g., 5 atm). Further, the gas flow profiles around the ribbon surfaces could be tailored to increase outgassing while also minimizing metallic contamination via gas transport.

There can be one or more gas zones with different gas mixtures around the ribbon. These gas zones can target one or more sides of the ribbon. In an instance, the gas zones can be configured to minimize metallic contamination to the ribbon surface. The gas zones can be separated by structural barriers or gas barriers, which can isolate each gas zone. For example, FIG. 8 has two zones that can use different gases.

As the depth of the low-oxygen zone (or denuded depth) can directly scale with the amount of time it spends at high temperatures (e.g., 1200-1420° C.), the length of the high temperature zone (Outgas Zone) can be configured such that the ribbon can dwell at a high temperature long enough to achieve the desired denuded zone depth at a given pull rate. A denuded zone depth (e.g., in the first region and second region) can be defined to be analogous to where oxygen concentrations in the silicon are below 8 ppma, compared to the bulk starting oxygen levels which are 8-25 ppma. Reducing the oxygen concentration is correlated with lower BMD densities. For increased MCL, it may be desired to have BMD densities below 1e9/cm$^3$. Specifically, to achieve the desired final zone depth for device manufacturing, the ribbon can be dwelled long enough in high temperatures to created denuded zone depths between 10-300 μm on either one or both ribbon surfaces. For stable crystal pull rates between 0.1 and 7 mm/s, the ribbon can stay at high temperatures (e.g., 1200-1414° C. or 1200-1420° C.) for lengths from approximately 5 cm to 200 cm, as shown in FIG. 8. As the depth of the low-oxygen profile zone from each respective wafer surface is determined by the amount of time that surface outgases to the environment, the denuded zone depth for the melt-facing ribbon surface (e.g., the second region) may be smaller because it spends less time exposed to the tool atmosphere. Therefore, the distance between the edge of the crucible where the ribbon separates and where the ribbon respectively cools (<1200° C.) can dictate the depth of that specific denuded zone depth. For this process, it may be desirable to have a relatively deep denuded zone on one wafer surface (approximately 100 μm) for producing semiconductor IC devices where the device only interacts with the top 100 μm of the wafer surface. It may also be desirable to have deep denuded zones from both wafer surfaces for the production of solar cells, where the low-oxygen profile enables the high bulk MCL. Specifically for solar cells, the depth of the denuded zone may be a fraction of the total ribbon thickness, such as from 10%-95%.

The solid ribbon can separate over the edge of the crucible at a slightly raised height of approximately 0.2 mm to 2 mm, which can ensure that a stable meniscus is maintained and that the melt does not spill over the lip of the crucible during separation. The crucible edge can also be shaped to include pinning features to increase meniscus or capillary stability. The gas pressure on the meniscus between the ribbon surface and the crucible can be increased to increase meniscus stability. One example on how to increase gas pressure is to locally focus an impinging jet directly at this meniscus formed between the crucible edge and the ribbon surface.

As the ribbon travels from the cold initializer to where it reaches room temperature, the ribbon is mechanically supported to minimize metallic contamination and the generation of defects. Mechanically deflecting a thin ribbon at high temperature can mechanically yield the ribbon and give rise to undesirable dislocations. Physical contact with the ribbon can locally result in undesirable slip, dislocations, and metallic contamination. As the ribbon floats on the melt surface, a mechanism to support the ribbon over the melt is optional. The ribbon can be supported as it separates over the edge of the crucible because that is where it is expected to experience the most mechanical deflection. The ribbon can be supported during the pulling after the ribbon is separated from the melt via several approaches, including gas flow levitation and/or a mechanical support. First, the ribbon can be levitated by directed gas flows that create local high or low pressures on the ribbon surface to support the ribbon. Examples of gas flow levitation approaches can include Bernoulli grippers, gas bearings, air-hockey tables, or other techniques that use gas pressure. Another approach is to mechanically support the ribbon with, for example, rollers or sliding rails. To minimize deleterious effects with this contact approach, the contact area between these supports and the ribbon surface may be minimized. The supports may be made of high temperature semiconductor-grade materials that do not readily contaminate silicon like silicon carbide, silicon nitride, quartz, or silicon. Deflection of the ribbon may be minimized to prevent the ribbon from mechanically yielding, warping, or producing structural defects.

Embodiments disclosed herein tailor the thermal profile and atmospheric conditions around the ribbon to achieve the desired defect profiles and final material properties as it cools to room temperature. Interstitial oxygen begins to precipitate at approximately 1000° C., and these precipitates can continue to grow in size until the ribbon temperature reduces to approximately below 800° C. Thermal annealing processes currently used by the semiconductor industry can control both the density and size of precipitates and their resulting BMDs by dwelling the wafers in these temperature regimes for specific periods of time. For example, to increase the size of oxygen precipitates as desired for creating a denuded zone, wafers are held for long periods of time at approximately 800° C. To minimize the evolution of precipitates as would be desired for high efficiency solar cells, wafers may dwell for as little time as possible at these temperatures. BMD densities below $1e9/cm^3$ are associated with high MCL, and BMD densities above approximately $1e11/cm^3$ locally create high internal gettering and thus low MCL. The embodiments disclosed herein create thermal zones around the ribbon as it travels from the crucible to the end of the tool to specifically control the oxygen-driven defect profiles in the ribbon. The temperature profiles along the length of the ribbon can both ramp the ribbon temperature from its original high temperature (e.g., 1200 to 1414° C.) to a specific intermediary temperature if appropriate, dwell for a given length of time if appropriate, repeat this ramping and dwelling at another temperature for as long as appropriate, and then finally ramp the ribbon down to room temperature (e.g., 15 to 25° C.). The temperature profiles can be created and maintained by a combination of resistive heaters, profiled insulation, radiative geometries and/or surfaces, and gas flows. These thermal profiles can be tailored so as to not generate defects by thermo-mechanical stress. The second derivative of a ribbon's temperature profile can cause thermal stress and even mechanically buckle a ribbon. This can be compensated for by introducing a lateral temperature profile across the ribbon width (normal to the pull direction). Thus, the gradients and second derivatives of the temperature profiles in the embodiments disclosed herein can be configured to not create this undesired thermal stress. For the expected pull rates of 0.1-7 mm/s, the entire cooling zone where the ribbon goes from high temperature to room temperature may be between 2 cm and 5 m.

In an instance, the time needed to create the denuded zone or zones in the ribbon can be from 1 minute to 60 minutes. This time to form the denuded zone or zones in the various temperature and/or gas zones in the tool can be while the ribbon is in the melt or after separation from the melt.

The system may include one or more temperature zones, which may be from 2 cm to 500 cm in length. The embodiment of FIG. 8 includes two temperature zones: the outgas zone and the cooling zone. More than two temperature zones are possible. Each of the zones can be separated or isolated. Gas curtains between the zones can provide isolation. Gas flows using particular pressures, gas flows combined with vacuum settings or vacuum pumps, baffles or other geometric structures, and/or the ribbon itself also can be used to isolate the zones from each other. In an instance, the zones can be separated by insulation, heat shields, heaters, or other physical mechanisms.

For example, the temperature zones can be from 800° C. to approximately 1414° C. using either an inert or reducing atmosphere. The dwell time can be from 1 minute to 60 minutes per temperature zone. In an instance, the temperature can be from greater than 1200° C. to approximately 1414° C. Additional gases, such as dopants, can be included at similar temperatures.

The temperature zones can form denuded regions in the ribbon while the ribbon is in the melt or when the ribbon is supported using gas flow levitation. This reduces the number of defects or dislocations that are created and the amount of contamination that occurs in the ribbon. Reduced physical contact with metallic components means that there is less metallic contamination. Dislocations in the ribbon also are reduced, which improves electrical performance.

Forming the denuded regions while the ribbon is in the melt also prevents sagging. Sagging can occur if a ribbon is cantilevered in space, which can generate slip or dislocations due to the ribbon's own weight via gravity.

In an instance, there may be sections where temperature is maintained at a temperature setpoint for a particular time to control defect profiles. A temperature gradient across the ribbon can be implemented to minimize the effects of thermal stress. The temperature gradient along the pull direction can be implemented to minimize the effects of thermal stress. The second derivative of the temperature profile can be controlled to minimize thermal stress and mechanical warpage. The system can include one or more temperature gradients and/or second derivatives. The temperature zones can be created and maintained by a combination of resistive heaters, profiled insulation, radiative geometries and/or surfaces, and gas flows.

In an instance, a zone for controlling oxygen outgassing can spatially overlap with a zone configured to minimize defects and create desired material properties in the ribbon.

In combination with the tailored thermal profile, the gas atmosphere and mechanical support of the ribbon can be tailored to also increase material performance as the ribbon transitions from high temperature to room temperature. The ribbon can be exposed to different gas mixtures to either create functionality or increase performance. Exposing the ribbon to an inert gas like argon or nitrogen can maintain its cleanliness, and creating a mixture of argon with a reducing gas like hydrogen can further assist the surface cleanliness.

Also, it has been shown that mixtures of argon, nitrogen, and oxygen can increase the precipitation of oxides if that is desired. Using a gas mixture containing oxygen and some water vapor can grow a thermal oxide on the wafer surface that minimizes metallic contamination. Another gas mixture can contain phosphorous oxychloride or a chloride gas. Exposing the ribbon to phosphorous oxychloride or chloride gas would have the combined effect of locally creating a wafer surface with a high phosphorous concentration and a protective glass surface. This highly doped surface would getter metallic contamination, and therefore increase bulk MCL which would be desirable for devices like solar cells. The glass surface would prevent further metallic contamination from the environment to the wafer. While the ribbon travels from the crucible to room temperature, there can be one or many gas mixtures exposed to the ribbon. These gas mixtures can be separated by gas curtains, guiding flow geometries, and other techniques intended to separate gas mixtures from each other. Atmospheric pressures in one or all of these gas zones can include low sub-atmospheric pressures (e.g., 0.01 atm) to positive-pressure systems (e.g., 5 atm). The tool atmosphere can be open to the ambient environment or sealed. The gas flow profiles around the ribbon surfaces can be tailored to increase outgassing while also minimizing metallic contamination via gas transport.

Tailoring a single-crystal ribbon's thermal profile to control defects or exposing it to specific gas mixtures that create desired material properties is beneficial. Direct production of tailored wafers using a single tool can offer a cost-reduction and reduced factory complexity compared to the multi-step processes currently performed to first form a wafer and then later process it to achieve certain wafer properties. The wafer can be formed and processed without risking contamination to the environment by moving the wafer between different machines.

After the ribbon is cooled to approximately room temperature, the ribbon can be singulated into discrete wafers. The wafers can be rectangular, square, pseudo square, circular, or any geometry that can be cut from a ribbon. Singulation can be performed by traditional techniques like laser scribing and cleaving, laser ablation, and mechanical scribing and cleaving. The final discrete wafer critical dimensions can range from 1 cm to 50 cm (e.g., 1-45 cm or 20-50 cm).

The wafers can then be further processed or marked to generate additional features or material properties for the final semiconductor devices or solar cells. In an example, the wafers can be ground and polished with chemicals or mechanical abrasion. In another example, the wafers can be either chemically textured or mechanically polished to create the desired final surface roughness. Material or geometry features can be added to the surface or in the bulk create the final desired devices. Example final products can include but are not limited to solar cells, MOSFETs, or anodes for lithium ion batteries.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
    providing a melt in a crucible, wherein the melt includes silicon;
    forming a ribbon floating on the melt using a cold initializer facing an exposed surface of the melt, wherein the ribbon is single crystal silicon;
    pulling the ribbon from the melt at a low angle off the melt surface, wherein the ribbon is formed at a same rate as the pulling; and
    separating the ribbon from the melt at a wall of the crucible where a stable meniscus forms, wherein the ribbon has a thickness between a first surface and a second surface from 50 μm to 5 mm after the separating, wherein the second surface faces the melt prior to the separating, wherein the first surface and the second surface are opposite each other, wherein the ribbon includes a first region extending a first depth from the first surface toward the second surface, and wherein the first region has a reduced oxygen concentration relative to a bulk of the ribbon.

2. The method of claim 1, wherein a speed of the pulling is from greater than 0.1 mm/s to 7 mm/s.

3. The method of claim 1, wherein the crucible has a length in a direction of the forming from greater than 5 cm to 200 cm.

4. The method of claim 1, wherein the ambient temperature around the ribbon is from 1200° C. to 1420° C. during the forming.

5. The method of claim 1, wherein an atmosphere around the ribbon has a pressure from 0.01 atm to 5 atm during the forming.

6. The method of claim 1, wherein an atmosphere around the crucible includes one or more of $H_2$, Ar, He, another inert gas, or a combination thereof during the forming.

7. The method of claim 1, wherein an atmosphere around the crucible during the forming includes oxygen and water vapor.

8. The method of claim 1, wherein an atmosphere around the crucible during the forming includes phosphorous oxychloride or a chloride gas.

9. The method of claim 1, wherein the pulling transports the ribbon through a plurality of gas zones after the separating, wherein each of the gas zones exposes the ribbon to a different gas.

10. The method of claim 1, wherein the pulling transports the ribbon through a first zone and a second zone, wherein the first zone and the second zone operate at different temperatures, and wherein outgassing oxygen occurs in the first zone.

11. The method of claim 10, wherein the first zone operates at from 1200° C. to 1400° C. and the second zone operates at less than 1200° C.

12. The method of claim 1, further comprising outgassing oxygen from the first surface of the ribbon while the ribbon is in the melt during the pulling.

13. The method of claim 1, further comprising outgassing oxygen from both the first surface and the second surface of the ribbon during the pulling after the separating.

14. The method of claim 1, wherein an atmosphere around the crucible further includes a dopant during the forming.

15. The method of claim 1, wherein the forming and pulling occur continuously to produce a ribbon from 0.2 m to 100 m in length.

16. The method of claim 1, wherein the ribbon has a bulk minority carrier lifetime greater than 100 μs.

17. The method of claim 1, further comprising supporting the ribbon during the pulling after the separating using gas flow levitation and/or a mechanical support, and wherein the supporting is configured to minimize contamination of the ribbon.

18. The method of claim 1, further comprising melting a portion of the ribbon into the melt during the pulling.

19. The method of claim 1, further comprising singulating the ribbon into one or more wafers.

20. A wafer produced using the method of claim 19.

21. The wafer of claim 20, wherein the wafer is a solar cell.

22. The wafer of claim 20, wherein the wafer is a semiconductor wafer.

23. The wafer of claim 20, wherein the wafer is a square, pseudo-square, rectangle, or circle.

24. The method of claim 1, wherein the thickness between a first surface and a second surface is from 50 μm to 300 μm after the separating.

25. The method of claim 1, wherein the first surface and the second surface are surfaces with a largest surface area on the ribbon.

26. The method of claim 1, wherein the first region has an oxygen concentration from 0.1 to 8.0 ppma.

27. The method of claim 1, wherein the bulk of the ribbon has an oxygen concentration from 8 to 25 ppma.

28. The method of claim 1, wherein the first depth is at least 5 μm.

29. The method of claim 1, wherein the first depth is from 5% to 90% of the thickness.

30. The method of claim 29, wherein the first depth is from 20% to 90% of the thickness.

31. The method of claim 1, wherein the first region has a reduced concentration of bulk micro defects relative to the bulk of the ribbon.

32. The method of claim 1, further comprising a second region extending a second depth from the second surface toward the first surface, and wherein the second region has a reduced oxygen concentration relative to the bulk of the ribbon disposed between the first region and the second region.

33. The method of claim 32, wherein the second region has an oxygen concentration from 0.1 to 8.0 ppma.

34. The method of claim 32, wherein the second depth is at least 5 μm.

35. The method of claim 32, wherein the first depth and the second depth combined is from 5% to 90% of the thickness.

36. The method of claim 32, wherein the second depth is approximately 10% of the thickness.

37. The method of claim 32, wherein the first region and the second region have a reduced concentration of bulk micro defects relative to the bulk of the ribbon disposed between the first region and the second region.

38. The method of claim 32, wherein the first depth and the second depth are different distances.

39. The method of claim 1, wherein the ribbon further includes a dopant.

40. The method of claim 1, wherein the ribbon has an average oxygen precipitate count from 0 to $1e11/cm^3$ in the first region.

41. A ribbon produced using the method of claim 1.

* * * * *

UNITED STATES PATENT AND TRADEMARK OFFICE
CERTIFICATE OF CORRECTION

| | | |
|---|---|---|
| PATENT NO. | : 11,885,036 B2 | Page 1 of 1 |
| APPLICATION NO. | : 17/634176 | |
| DATED | : January 30, 2024 | |
| INVENTOR(S) | : Appel et al. | |

It is certified that error appears in the above-identified patent and that said Letters Patent is hereby corrected as shown below:

In the Specification

Column 1, Line 12 should read:
--STATEMENT REGARDING FEDERALLY SPONSORED RESEARCH OR DEVELOPMENT
This invention was made with government support under DE-EE0008132 awarded by the U.S. Department of Energy. The government has certain rights in the invention.--

Signed and Sealed this
Nineteenth Day of March, 2024

Katherine Kelly Vidal
*Director of the United States Patent and Trademark Office*